(12) United States Patent
Benedix et al.

(10) Patent No.: US 6,738,309 B2
(45) Date of Patent: May 18, 2004

(54) SEMICONDUCTOR MEMORY AND METHOD FOR OPERATING THE SEMICONDUCTOR MEMORY

(75) Inventors: Alexander Benedix, München (DE); Kazimierz Szczypinski, München (DE); Helmut Fischer, Oberhaching (DE); Johann Pfeiffer, Ottobrunn (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/154,597

(22) Filed: May 23, 2002

(65) Prior Publication Data

US 2002/0176316 A1 Nov. 28, 2002

(30) Foreign Application Priority Data

May 23, 2001 (DE) .......................... 101 25 371

(51) Int. Cl.⁷ ................................................. G11C 8/00
(52) U.S. Cl. ....................................... 365/233; 365/236
(58) Field of Search .................................. 365/233, 236

(56) References Cited

U.S. PATENT DOCUMENTS 6,192,004 B1 * 2/2001 Aikawa et al. ............. 365/233
6,262,938 B1 * 7/2001 Lee et al. .................... 365/233
6,480,946 B1 * 11/2002 Tomishima et al. ......... 711/167

OTHER PUBLICATIONS

Data Sheet: "HYB25D256400/800I/AT 256–Mbit Double Data Rata SDRAM", *Infineon Technologies AG, dated Sep. 2000*, 73 pgs.

* cited by examiner

*Primary Examiner*—Vanthu Nguyen
(74) *Attorney, Agent, or Firm*—Lauarence A. Greenberg; Werner H. Stemer; Ralph E. Locher

(57) ABSTRACT

A semiconductor memory is described which has a clock input, a signal input, a data output, a measuring device, a control circuit, and a latency. The latency elapses between the activation of the signal input and the availability of the data to be read at the data output. A clock signal is fed to the clock input. On the basis of the clock signal, the measuring device determines a value for the latency and the control circuit configures the semiconductor memory with the determined value for the operation of the semiconductor memory.

17 Claims, 2 Drawing Sheets

SEMICONDUCTOR MEMORY AND METHOD FOR OPERATING THE SEMICONDUCTOR MEMORY

BACKGROUND OF THE INVENTION

Field of the Invention

The present application relates to a semiconductor memory and a method for operating the semiconductor memory.

Semiconductor memories, such as dynamic random access memories (DRAMs), for example, contain a cell array and an addressing periphery, individual memory cells being disposed in the cell array. Synchronous dynamic random access memories (SDRAMs) are supplied with an external clock in order thus to ensure the synchronism of the memory with its surroundings.

Besides SDRAMs the present patent application likewise relates to static random access memories (SRAM) and to nonvolatile memories such as ROMs (Read Only Memory), EPROMs (Electrical Programmable Read Only Memory), EEPROMs (Electrical Erasable Programmable Read Only Memories) and further memories that have a latency during a read-out or require a waiting time during read-out.

A latency is usually a waiting time which elapses between the application of an addressing signal to the memory and the end of the subsequent execution of switching processes in the memory. See Infineon Data Sheet HYB25D256400/800T/AT 256-Mbit Double Data Rate SDRAM.

The associated field of the invention is described below with reference to a DRAM or an SDRAM, but is in no way restricted to the DRAM or the SDRAM. The explanation of the SDRAM serves merely to provide a better understanding of the invention.

An SDRAM chip contains a matrix of memory cells that are disposed in the form of rows and columns and are addressed by word lines and bit lines. The read-out of data from the memory cells or the writing of data to the memory cells is realized by the activation of suitable word lines and bit lines.

A memory cell of the SDRAM usually contains a transistor connected to a capacitor. The transistor is usually referred to as selection transistor, is configured as a field-effect transistor and contains, inter alia, two diffusion regions which are isolated from one another by a channel controlled by a gate. One of the diffusion regions is referred to as a drain region and the other diffusion region is referred to as a source region.

One of the diffusion regions of the transistor is connected to a bit line, the other diffusion region of the transistor is connected to a capacitor, and the gate of the transistor is connected to a word line. By the application of suitable voltages to the gate, the selection transistor is controlled in such a way that a current flow between the diffusion regions through the channel that is switched on and off.

A clock signal is usually fed to contemporary DRAM memories and so these memories are referred to as SDRAM (Synchronous Dynamic Random Access Memories). The rest of the memory modules mentioned above can likewise be embodied as clocked memories.

A typical latency of the SDRAM is the column address strobe (CAS) latency, which elapses during the read-out of an information item from the SDRAM between the switching of a command signal input (CAS signal input) of the SDRAM chip and the subsequent availability of the data read from the SDRAM memory at the data outputs of the SDRAM chip. In this case, the CAS signal input serves for registering and starting a reading process or a writing process. In clocked memories the CAS latency is usually specified in a number of clock cycles and is typically 1 or 2 or 3 or 4 or 5, fractional CAS latencies such as 2.5, for example, likewise being possible. Preferred latencies that are used are 2 or 2.5 or 3.

It is known from the prior art that the CAS latency of the SDRAM can be programmed in the SDRAM by the application of a predetermined address and predetermined data during the mode register set command from outside the SDRAM chip, the values being programmed into a mode register contained in the SDRAM chip.

SUMMARY OF THE INVENTION

It is accordingly an object of the invention to provide a semiconductor memory and a method for operating the semiconductor memory that overcome the above-mentioned is disadvantages of the prior art methods and devices of this general type, wherein a latency of the semiconductor memory can be set in a simplified manner.

With the foregoing and other objects in view there is provided, in accordance with the invention, a semiconductor memory. The memory contains a clock input for receiving a clock signal, a data output for outputting data to be read, a signal input for receiving a control signal. The control signal initiates a reading-out of the data in a manner dependent on a predetermined signal state of the control signal. A latency elapses between the predetermined signal state of the signal input and an availability of the data to be read at the data output. A measuring device is used for determining a frequency-dependent characteristic of the clock signal, the measuring device is connected to the clock input. A control circuit is provided for controlling the latency in a manner dependent on the frequency-dependent characteristic.

With regard to the semiconductor memory, the object is achieved by the semiconductor memory having the clock input at which the clock signal can be fed in, the data output at which data that are to be read from the semiconductor memory can be provided, and the signal input, at which the control signal can be fed in in order to initiate a read-out of the data in a manner dependent on a predetermined signal state of the control signal. A latency elapsing between the predetermined signal state of the signal input and the availability of the data to be read at the data output. A measuring device is provided, which can be used to determine a frequency-dependent characteristic of the clock signal, and a control circuit is provided which can be used to control the latency in a manner dependent on the frequency-dependent characteristic.

What is made possible as a result of this is that the latency can be determined automatically and independently by the memory in a manner dependent on the applied clock frequency. The configuration of the semiconductor memory with the determined latency is subsequently possible. This is advantageous insofar as a fixed, prescribed and finite number of different clock frequencies are used in practice. Consequently, the semiconductor memory specified is suitable for evaluating the clock frequency applied to the semiconductor memory in order to configure itself with a suitable latency. This can be carried out for example during the start phase of the memory. It is equally possible to repeat the configuration of the latency during the operation of the memory, at predetermined time intervals.

Since nowadays it is typically the case that only a fixedly predetermined and selected number of frequencies are provided for the operation of memories and the frequencies can easily be differentiated from one another on account of their large frequency difference, a cost-effective circuit configuration with limited accuracy is advantageously suitable. Therefore, a configuration of the memory can be obviated on the part of a customer or user, which provides an advantage.

The latency or the CAS latency is thus a measure of the time duration required by a semiconductor memory or an SDRAM memory for provision of the data to be read.

In one refinement of the invention, it is provided that the clock signal has a frequency, a value for the frequency of the clock signal can be determined by the measuring device, and the latency can be determined on the basis of the value for the frequency of the clock signal.

This makes it possible, for example, to determine the value for the frequency of the clock signal, the value for the frequency of the clock signal subsequently being used to select a suitable value for the latency.

In a further refinement of the semiconductor memory, it is provided that a register for storing a value for the latency is provided. The register may be, for example, a so-called mode register by which the memory can be configured. In this case, the present configuration of the memory is stored in the mode register.

The storage of the determined value for controlling the semiconductor memory makes it possible for the semiconductor memory to be configured with a determined second value, so that the semiconductor memory can be operated in accordance with its circuitry environment that is prescribed by the clock signal.

In a further refinement of the semiconductor memory according to the invention, it is provided that at least two values for the latency are stored in the semiconductor memory, and at least one of the two values can be selected as the value for the latency on the basis of the clock signal and can be stored in the register for controlling the semiconductor memory.

Prescribing at least two values for latencies enables all appropriate latencies to be stored in the memory. In a manner dependent on the frequency of the clock signal, the latency that corresponds to the frequency of the clock signal and to the capabilities of the semiconductor memory is then selected from the multiplicity of stored latencies. In this case, by way of example, an assignment in tabular form is suitable. To that end, a corresponding latency is assigned to every possible clock frequency and stored in the semiconductor memory.

In a further refinement of the semiconductor memory, it is provided that the measuring device contains a generator for generating a reference signal with a reference frequency, and the measuring device contains a circuit device which can be used to determine the value for the frequency of the clock signal on the basis of the reference frequency of the reference signal.

A reference signal with a predetermined reference frequency can be generated by a generator, and the reference signal can be used by the semiconductor memory for determining the frequency of the clock signal. In this case, the value for the frequency of the clock signal is advantageously determined with the aid of a reference frequency generated in the memory.

In a further refinement of the semiconductor memory, it is provided that the measuring device has a first counter for determining a first period number of the clock signal in a manner dependent on the reference signal, or the measuring device has a second counter for determining a second period number of the reference signal in a manner dependent on the clock signal.

The first counter can be used to determine the period number of the clock signal during a predetermined period of time. It is equally possible to determine the period number of the reference signal during a predetermined period of time.

By way of example, a period duration or a multiple of the period duration of the reference signal can be used to start and stop the first counter for determining the period number of the clock signal. Using the number of periods, the frequency of the clock signal and thus the CAS latency can subsequently be determined from the known frequency of the reference signal.

It is equally possible for one or a multiplicity of periods of the clock signal to be used for the determination of the second period number by the second counter. In this case, the second counter is started and stopped in a manner dependent on the clock signal and the number of periods of the reference signal counted by the second counter is used to determine the CAS latency.

With regard to the method, the above-mentioned object is achieved by providing a semiconductor memory having a clock input, a signal input, a data output, a measuring device and a control circuit. A clock signal is feed to the clock input and a value for a latency of the semiconductor memory is determined by the measuring device in a manner dependent on the clock signal. The semiconductor memory is configured by the control circuit with the determined value. For reading data from the semiconductor memory, a control signal is fed to the signal input and, in a manner dependent on a predetermined signal state of the control signal, a read-out of the data being initiated and the latency elapsing between the predetermined signal state of the signal input and the availability of the data to be read at the data output.

In an advantageous refinement of the method according to the invention, it is provided that a register is disposed in the semiconductor memory, in which the value for the latency is stored.

In a further advantageous refinement of the method according to the invention, it is provided that at least two values for the latency are stored in the semiconductor memory, and at least one of the two values is selected as the value for the latency on the basis of the clock signal and is stored in the register for controlling the semiconductor memory.

In a further advantageous refinement of the method according to the invention, it is provided that the measuring device contains a generator, the generator generates a reference signal with a reference frequency, and the measuring device determines the value for the frequency of the clock signal on the basis of the reference frequency of the reference signal.

In a further refinement of the method according to the invention, it is provided that the measuring device contains a first counter, which counts a first period number of the clock signal, and the measuring device determines the value for the latency of the semiconductor memory on the basis of the first period number.

In a further advantageous refinement of the method according to the invention, it is provided that the measuring device contains a second counter, which counts a second period number of the reference signal, and the measuring device determines the value for the latency of the semiconductor memory on the basis of the second period number.

In a further advantageous refinement of the method according to the invention, it is provided that a multiplicity of values for the latencies are stored in the semiconductor memory, and the value for the latency on the basis of the clock signal is selected from the multiplicity of values for the latencies and is stored in the register for controlling the semiconductor memory.

Other features which are considered as characteristic for the invention are set forth in the appended claims.

Although the invention is illustrated and described herein as embodied in a semiconductor memory and a method for operating the semiconductor memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
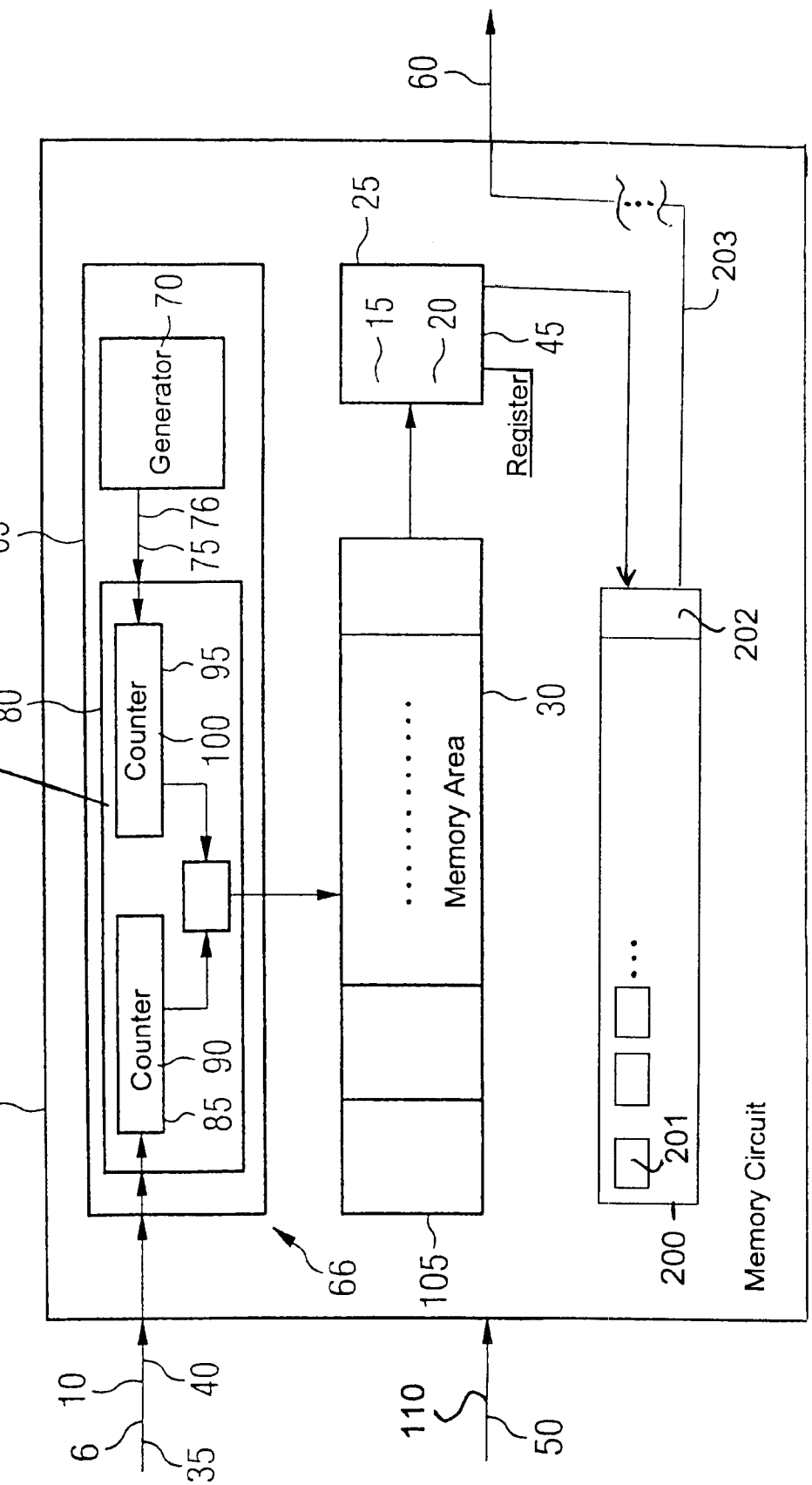
FIG. 1 is a block diagram of a memory having a circuit configuration for setting a latency of the memory according to the invention.

Referring now to the figures of the drawing in detail and first, particularly, to FIG. 1 thereof, there is shown a semiconductor memory 5 having a clock input 6, a signal input 50 and a data output 60. A clock signal 10 is fed to the clock input 6. The clock signal 10 has a frequency 35, a value 40 characterizing the frequency 35 of the clock signal 10. In an SDRAM, for example, the signal input 50 serves for validating the addresses present on address lines and communicating them into the semiconductor memory 5. By way of example, during a reading process, data from the memory 5 are provided at the data output 60.

A measuring device 65 and a control circuit 66, 202 are disposed in the semiconductor memory 5. The measuring device 65 is suitable for determining the value 40 of the frequency 35 of the clock signal 10 in a manner dependent on the frequency 35 of the clock signal 10. The measuring device 65 contains a generator 70 that is suitable for generating a reference signal 76 with a reference frequency 75. Furthermore, the measuring device 65 contains a circuit device 80, to which both the clock signal 10 and the reference signal 76 are fed. The circuit device 80 contains, for example, a first counter 85, to which the clock signal 10 is fed, and a second counter 95, to which the reference signal 76 is fed. The first counter 85 is suitable for determining a first period number 90. The second counter 95 is suitable for determining a second period number 100. The memory 5 additionally contains a memory area 30, in which a multiplicity of predetermined latencies 105 are stored. The measuring device 65 and the circuit device 80 contained in it are suitable for selecting a value 15 for a latency 20 from the multiplicity of predetermined latencies 105 and storing it in a register 25, which configures the memory 5. The first value 15 for the latency 20 is stored in the register 25.

The memory circuit 5 includes a memory cell array 200 that contains a multitude of memory cells 201. The memory cell array 200 is connected to the output terminal 60 through a data path 203. The data stored in the memory cells 201 of the memory cell array 200 can be outputted through the output terminal 60 in response to a predetermined signal state of the control signal applied to the signal input line 50. The control circuit 202 controls the latency of the read data according to the principles shown in FIG. 2.

As an alternative embodiment of the invention, the signal generator 70 is coupled to the counter that counts the pulses of the external clock signal between two successive edges of the reference clock signal generated by the signal generator 70. The frequency of the internally generated clock signal must be greater than the frequency of the largest possible frequency of the external clock signal.

Figure 2:
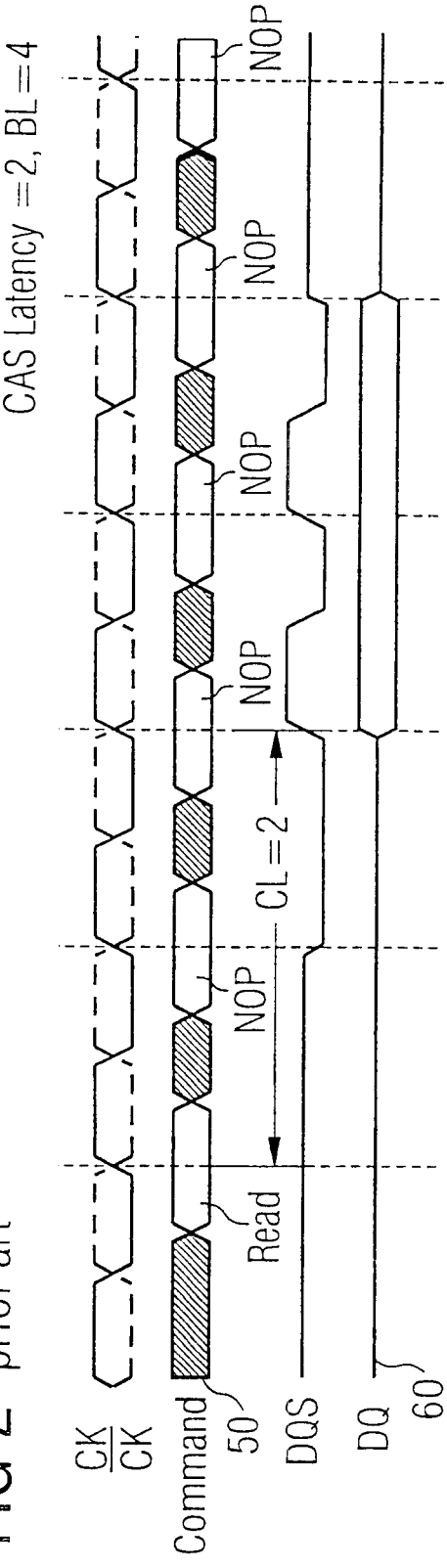
FIG. 2 is a timing diagram of a read-out of an SDRAM memory, which reveals a time duration of the CAS latency.
Figure 2:
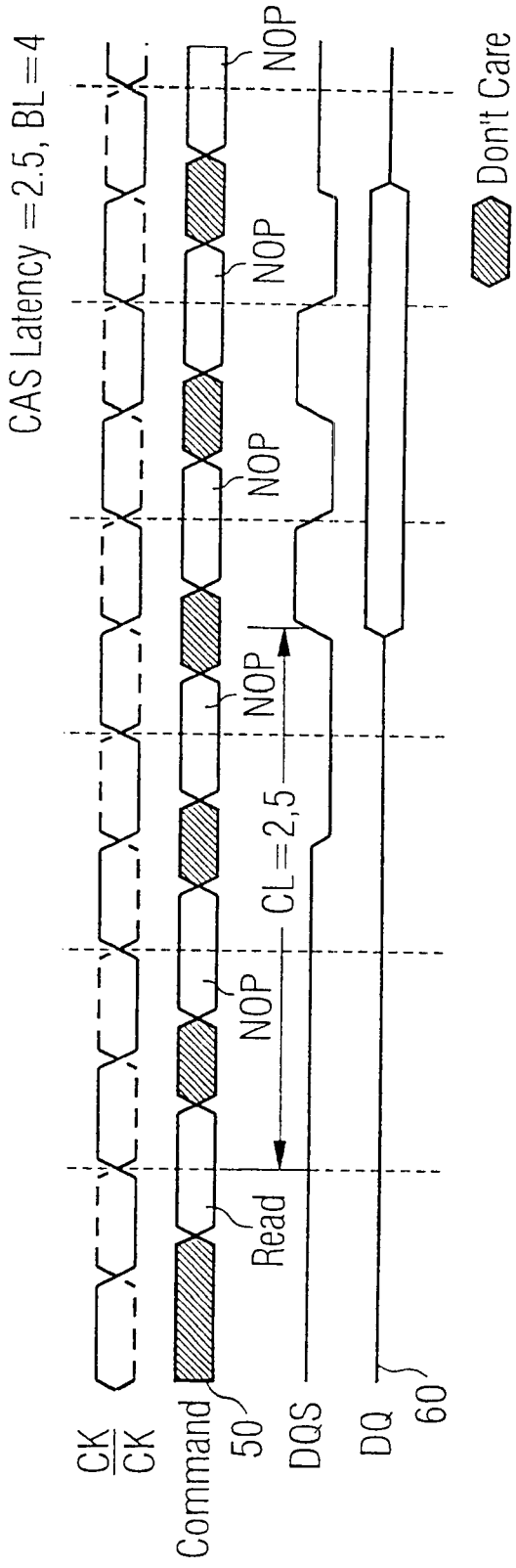

FIG. 2 illustrates a timing diagram for the read-out of an SDRAM memory that is known from the prior art. The upper diagram of FIG. 2 illustrates the read-out of data from the SDRAM memory with a CAS latency of 2 and the lower diagram illustrates the read-out of data from the SDRAM memory with a latency of 2.5 periods. As a result of a predetermined signal state 110, in the event of a rising edge of the clock signal CK, a read operation is triggered by a read signal on the signal line 50. The data are available at the data output 60 after 2 and 2.5 clock cycles, respectively.

We claim:

1. A semiconductor memory, comprising:
   a clock input for receiving a clock signal having a frequency;
   a measuring device for determining a value representative of the frequency of the clock signal and a frequency-dependent characteristic of the clock signal, said measuring device connected to said clock input;
   a data output for outputting data to be read;
   a signal input for receiving a control signal, the control signal initiating a read-out of the data in a manner dependent on a predetermined signal state of the control signal, a latency elapsing between the predetermined signal state of said signal input and an availability of the data to be read at said data output, said latency to be determined on a basis of the value representative of the frequency of the clock signal; and
   a control circuit for controlling the latency in a manner dependent on the frequency-dependent characteristic, said control circuit connected to said data output.

2. The semiconductor memory according to claim 1, further comprising a register for storing a value for the latency and coupled to said measuring device.

3. The semiconductor memory according to claim 2, further comprising a memory connected to said register and storing at least two values for the latency, and at least one of the two values can be selected as the value for the latency on a basis of the clock signal and is stored in said register for controlling the semiconductor memory, said memory further connected to said measuring device.

4. The semiconductor memory according to claim 1, wherein said measuring device contains a generator for generating a reference signal with a reference frequency, and said measuring device contains a circuit device for determining the value of the frequency of the clock signal on a basis of the reference frequency of the reference signal.

5. The semiconductor memory according to claim 4, wherein said measuring device has a counter for determining a period number of the clock signal in a manner dependent on the reference signal.

6. The semiconductor memory according to claim 4, wherein said measuring device has a counter for determining a period number of the reference signal in a manner dependent on the clock signal.

7. A method for operating memories, which comprises the steps of:
   providing a semiconductor memory having a clock input, a signal input, a data output, a measuring device and a control circuit;
   feeding a clock signal to the clock input;
   using the measuring device for determining a value for a latency of the semiconductor memory in a manner dependent on the clock signal;
   storing the value for the latency in a register of the semiconductor memory;
   using the control circuit to configure the semiconductor memory taking into account the value of the latency;
   feeding a control signal to the signal input for initiating a reading out of data from the semiconductor memory in a manner dependent on a predetermined signal state of the control signal, and the latency elapsing between an availability of the predetermined signal state of the signal input and the availability of the data to be read at the data output; and
   reading the data at the data output.

8. The method according to claim 7, which comprises storing at least two values for the latency in the semiconductor memory, and at least one of the two values is selected as the value for the latency on the basis of the clock signal and is stored in the register for controlling the semiconductor memory.

9. The method according to claim 7, which comprises forming the measuring device with a generator, the generator generating a reference signal with a reference frequency, and the measuring device determines a value for a frequency of the clock signal on the basis of the reference frequency of the reference signal.

10. The method according to claim 9, which comprises forming the measuring device with a counter counting a period number of the clock signal, and the measuring device determining the value for the latency of the semiconductor memory on the basis of the period number.

11. The method according to claim 10, which comprises forming the measuring device with a further counter counting a further period number of the reference signal, and the measuring device determines the value for the latency of the semiconductor memory on the basis of the further period number.

12. The method according to claim 1, which comprises:
   storing a multiplicity of values for latencies in the semiconductor memory;
   selecting the value for the latency on the basis of the clock signal from the multiplicity of values of or latencies resulting in a selected value; and
   storing the selected value in the register for controlling the semiconductor memory.

13. A method for operating memories, which comprises the steps of:
   providing a semiconductor memory having a clock input, a signal input, a data output, a measuring device and a control circuit;
   feeding a clock signal to the clock input;
   generating a reference signal having a reference frequency with a generator of the measuring device;
   determining a value representative of a frequency of the clock signal on a basis of the reference frequency with the measuring device;
   determining a value for a latency of the semiconductor memory in a manner dependent on the clock signal using the measuring device;
   using the control circuit to configure the semiconductor memory taking into account the value of the latency;
   feeding a control signal to the signal input for initiating a reading out of data from the semiconductor memory in a manner dependent on a predetermined signal state of the control signal, and the latency elapsing between an availability of the predetermined signal state of the signal input and the availability of the data to be read at the data output; and
   reading the data at the data output.

14. The method according to claim 13, which further comprises storing at least two values for the latency in the semiconductor memory, and selecting at least one of the two values as the value for the latency on the basis of the clock signal and storing the at least one of the two values in the register for controlling the semiconductor memory.

15. The method according to claim 13, which further comprises forming the measuring device with a counter counting a period number of the clock signal, and determining, with the measuring device, the value for the latency of the semiconductor memory on the basis of the period number.

16. The method according to claim 15, which further comprises forming the measuring device with a further counter counting a further period number of the reference signal, and determining, with the measuring device, the value for the latency of the semiconductor memory on the basis of the further period number.

17. The method according to claim 13, which further comprises:
   storing a multiplicity of values for latencies in the semiconductor memory;
   selecting the value for the latency on the basis of the clock signal from the multiplicity of values for latencies resulting in a selected value; and
   storing the selected value in the register for controlling the semiconductor memory.

* * * * *